TUNNEL DIODE AMPLITUDE MODULATION DETECTOR

Filed Dec. 31, 1962

INVENTOR:
JOSEPH A. WORCESTER,

BY *Norman C. Fulmer*
HIS ATTORNEY.

United States Patent Office 3,324,402
Patented June 6, 1967

3,324,402

TUNNEL DIODE AMPLITUDE MODULATION DETECTOR

Joseph A. Worcester, Frankfort, N.Y., assignor to General Electric Company, a corporation of New York Filed Dec. 31, 1962, Ser. No. 248,468
6 Claims. (Cl. 329—205)

This invention relates to a detector circuit for an amplitude modulated signal, and more particularly to a tunnel diode detector circuit.

A typical semiconductor diode does not perform as an efficient detector for signal voltages less than a fraction of a volt. With a detector circuit using such a diode, much distortion results when the envelope of the amplitude modulated signal decreases to less than one-half volt. The percentage modulation which may be tolerated without dropping below the one-half volt level depends upon the average strength of the amplitude modulated signal. Stronger amplitude modulated signals allow a higher percentage modulation before great distortion occurs in the detector output signal.

In the usual equipment using vacuum tubes in amplifiers preceding the detector, normally it is a simple matter to provide a signal of sufficient strength to the detector, so that serious distortion is avoided in the detected signal. With the advent of the transistor and other similar semiconductor devices in the electronics industry, such high signal voltages are not readily obtainable. Semiconductor devices are inherently of much lower impedance than their vacuum tube counterparts, and the low impedances which must be used therewith consume excessive power when operated at high voltage levels. In addition, semiconductor circuitry is oftentimes employed where the power supply for circuit energization is limited in voltage and/or power capability. Specific examples of such power supplies include solar cell and carrier signal power sources. Therefore, the ideal detector should not only accept low signal levels and high modulation percentages without distortion, but should perform efficiently and conserve power. To conserve power a full-wave detector circuit is preferable, i.e. one which detects during both positive and negative half-cycle excursions of the input signal.

It is, accordingly, an object of the present invention to provide an improved amplitude modulation detector circuit having little distortion even when subjected to high percentages of modulation.

It is another object of the present invention to provide an improved amplitude modulation detector circuit which performs efficiently with low amplitude input signals.

It is a still further object of the present invention to provide a full-wave amplitude modulation detector having only a single detecting element.

In accordance with this invention, a tunnel diode is used as a detecting element. The diode characteristic curve exhibits a positive resistance up to a "peak point" voltage, after which a negative resistance characteristic is exhibited. The normal tunnel diode peak point voltage is about one-tenth the minimum voltage below which conventional diodes cease to detect efficiently. The tunnel diode is provided with a stable bias near the peak point by a source of voltage having an internal resistance less than the negative resistance characteristic of the diode. An amplitude modulated signal is supplied to the input of the tunnel diode and a reduction of current flow attends both positive and negative voltage excursions. A filter is provided in the diode output circuit to by-pass the high frequency carrier component of the input signal. A full-wave detection of the modulation then occurs and appears as an audio voltage across the filter.

Although the novel features which are believed to be characteristic of this invention will be pointed out with particularity in the claims appended hereto, the invention itself, its objects and advantages, the manner of its organization and the mode of its operation will be better understood by referring to the following description taken in connection with the accompanying drawing forming a part thereof in which:

FIG. 1 shows a plot of current flow through a tunnel diode for various amplitudes of forward bias voltage, current being plotted as ordinates and applied voltage as abscissas.

Figure 1:
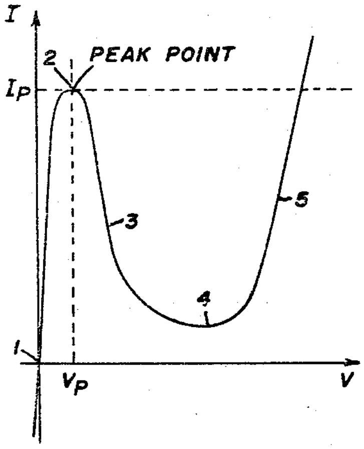
FIG. 1 shows that static characteristic curve of a tunnel diode.

The diode exhibits a positive resistance characteristic, wherein current increases with increasing values of voltage, from the origin 1 to peak point 2. The peak point voltage is denominated $V_p$ and the corresponding current is $I_p$. There is a relatively linear negative resistance region between peak point 2 and point 3 on the characteristic curve. The curve continues from point 3 in a more gently sloping negative resistance characteristic to valley point 4, after which the characteristic curve exhibits a positive resistance characteristic. Beyond point 5 the curve closely approximates a normal diode characteristic caused by minority carrier current.

For a typical germanium tunnel diode, the values for the various parameters shown in the characteristic curve of FIG. 1 might include a peak point voltage $V_p$, shown at 2, equal to 50 mv. associated with a current flow $I_p$ equal to 1.0 ma. Point 3 might occur at a voltage of 150 mv., valley point 4 at about 350 mv. and normal diode characteristic would commence at a point 5 value of 500 mv.

Assuming that a tunnel diode, having the characteristic curve of FIG. 1, is provided with a stable quiescent, or zero signal, bias at peak point 2, it may be seen that a reduction in voltage provides a lessened current flow generally following the curve between peak point 2 and point 1. An increase in voltage likewise provides a decrease in current, however, generally following the curve between peak point 2 and point 3. Since the positive slope between point 1 and peak point 2 is nearly equivalent to the negative slope between point 3 and peak point 2, the change in current flow is approximately equal for positive or negative voltage excursions of the same magnitude. Therefore, a diode biased to peak point 2 will pass a current corresponding to an inverted full-wave detection of an applied alternating current signal since the current will have a quiescent value of $I_p$ and decrease for both positive and negative excursions of an associated alternating current voltage. For greater amplitudes of alternating current voltage, the magnitude of current reduction through the diode will become greater.

Figure 2:
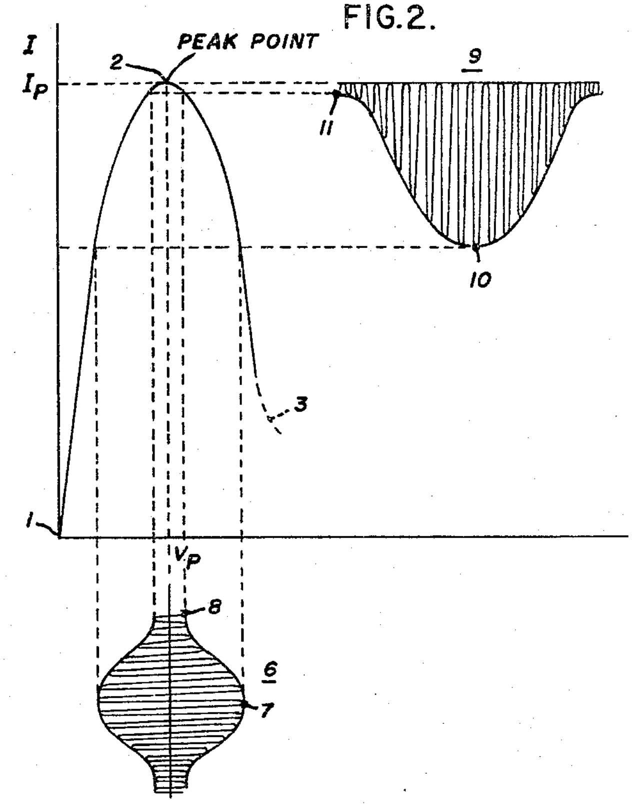
FIG. 2 is an expanded view of the initial portion of a tunnel diode characteristic curve.

FIG. 2 shows the response, of a tunnel diode biased at its peak point 2, to an amplitude modulated signal 6 having crests of positive signal modulation 7 and valleys of negative modulation 8. The inverted full-wave detected waveform, generally shown at 9, shows the inverted peak 10, corresponding to point 7 on the amplitude modulated wave. Minimum point 11 corresponds to valley point 8 of the amplitude modulated signal. It will be noted that the envelope of waveform 9 generally corresponds to an inversion of the original modulating signal of amplitude modulated wave 6, thus, providing a detection of the modulating signal.

Figure 3:
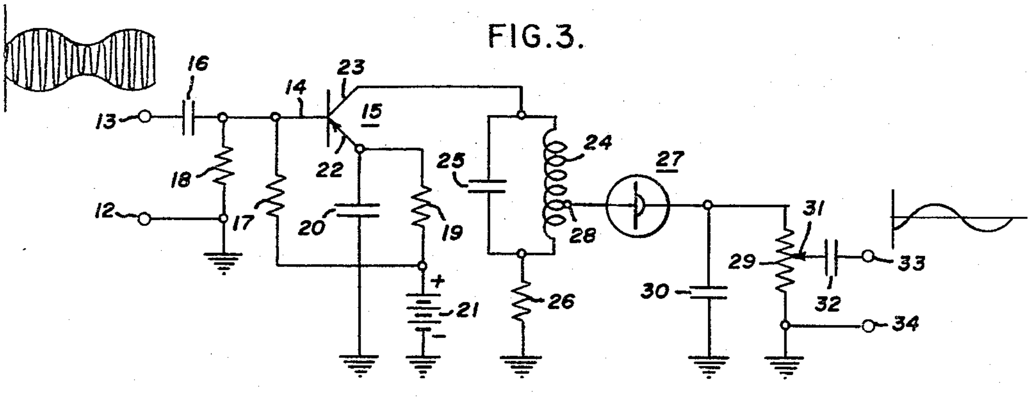
FIG. 3 is a schematic circuit diagram of a specific embodiment of the invention.

Turning to FIG. 3, there is shown therein a specific embodiment of my invention showing particular means to bias a tunnel diode to its peak point voltage together with means to supply an amplitude modulated signal to the diode for detection. The circuit comprises input terminals 12 and 13 which provide a means of connection to a source of amplitude modulated signal to be detected. The input signal is coupled to base 14 of transistor 15 through coupling capacitor 16, which provides direct current isolation to protect both the source of amplitude modulated signal and the detector circuit. Base-biasing resistors 17 and 18 are disposed in series across power supply 21 and provide a suitable voltage, at their junction, for base 14 of transistor 15 such that amplification in the class A mode is provided. Emitter resistor 19, and its associated by-pass capacitor 20 further aid in establishing the appropriate quiescent operating point for transistor 15. The power supply 21 is serially disposed with resistor 19 in the ground-return path for emitter 22 of transistor 15.

In providing an amplified signal corresponding to the input signal received at terminals 12 and 13, collector 23 of transistor 15 is connected to a tuned load circuit, comprising inductance 24 and capacitance 25 which resonate at the modulated carrier frequency. The direct current path for collector 23 is completed, through inductance 24 and serially disposed resistor 26, to the ground point as shown in the drawing. The purpose of resistor 26 is to provide the small voltage drop needed to bias tunnel diode 27 near its peak point voltage.

Examination of the direct biasing path for tunnel diode 27 shows the path to include voltage dropping resistor 26, a few turns of inductance 24 as determined by the location of tap 28 thereon, and tapped resistor 29, which is disposed in the cathode circuit of the diode. In order to provide a stable bias for tunnel diode 27, it is apparent that the bias source resistor 26 must be of lesser magnitude than the negative resistance of the diode. In practice, it has been found that a resistor having a value of 39 ohms provides such a stable bias for germanium tunnel diodes. A resistor of 500 ohms has been found to provide satisfactory performance in the position of tapped resistor 29. It is apparent that with these values, assuming a tunnel diode peak point current, $I_p$, equal to 0.1 ma., the voltage drop across tapped resistor 29 will equal 0.05 volt in the quiescent state. Therefore, the voltage drop across resistor 26 should be approximately 0.1 volt to provide a forward bias of 0.05 volt (50 mv.). This condition is met by suitably biasing transistor 15 such that a current of about 2.5 ma. flows through 39 ohm resistor 26.

Turning, now, to the alternating current signal path through the circuit of FIG. 3, it may be seen that the amplitude modulated signal supplied to terminals 12 and 13 is amplified by transistor 15 and appears across inductance 24. A low impedance tap 28 on inductance 24 provides an input signal to the anode of tunnel diode 27. The tunnel diode passes an alternating current of waveform corresponding to an inverted full-wave detection, as previously discussed in conjunction with the graphical representation of FIG. 2. Thereafter, the high frequency component of the amplitude modulated signal is bypassed to ground through capacitor 30, leaving the modulating signal or detected envelope appearing across tapped resistor 29. The detected modulating signal is derived from tap 31 on tapped resistor 29 and coupled through coupling capacitor 32 to terminal 33. Terminal 34 provides the necessary ground-return path for the detected signal.

A practical embodiment of the circuit shown in FIG. 3 was constructed with the following specific values:

| | | |
|---|---|---|
| Capacitors: | | |
| 16 | mf | 0.05 |
| 20 | mf | 0.05 |
| 25 | mmf | 200 |
| 30 | mf | 0.05 |
| Resistors: | | |
| 17 | ohms | 4700 |
| 18 | do | 4700 |
| 19 | do | 680 |
| 26 | do | 390 |
| 29 | do | 470 |
| Supply voltage: | | |
| 21 | volts | 9 |
| Transistor: | | |
| 15 | | 2N247 |

The above-mentioned components were selected to provide a quiescent bias of a germanium tunnel diode near its peak point. The specific value of inductance 24 was selected to resonate with capacitor 25 at the input carrier frequency, as is well known in the art. The exact position of tap 28 on inductance 24 is not critical, but should be selected to provide a relatively low input impedance to tunnel diode 27. With the specific embodiment of the circuit of FIG. 3, it was found that a 100% amplitude modulated signal of 58 microvolts, introduced at terminals 12 and 13, produced an output audio voltage at terminals 33 and 34 of 3 millivolts. With an ordinary diode, substituted for the germanium tunnel diode, the input voltage to terminals 12 and 13 was raised to 240 microvolts in order to produce the same level of audio output at terminals 33 and 34. It is apparent that the use of a tunnel diode in the circuit of FIG. 3 allows a significant reduction in required input voltage to the detector circuit.

The advantages enjoyed by using the teaching of this invention will be apparent to those skilled in the art. A reduction in the required input signal strength to less than one-fourth that required by conventional detectors, for comparable performance, lessens the amplification which must be obtained from preceding stages in devices such as semiconductor radio receivers, for example. Therefore, the preceding stages may be conservatively designed with attendant higher reliability and more faithful reproduction achieved through increased negative feedback, as is known in the art. In some instances the increased detection efficiency allows omission of an amplifying stage, with considerable reduction in the cost of manufacturing. The detector of this invention is particularly well adapted for use in portable transistor radios of the type which reproduce the voice and music which is amplitude modulated upon a radio frequency carrier in the commercial broadcast band.

While the tunnel diode detector of this invention is shown in conjunction with a transistor amplifier signal supply circuit, this showing is intended to be in no way limiting, and the tunnel diode detector adapts readily to other sources of signal supply. It is apparent that the source of amplitude modulated signal to the tunnel diode detector need not additionally provide the diode bias, as shown, but the biasing and supply functions may be achieved through independent circuitry. In addition, in some uses the signal strength at an associated receiving antenna may be sufficient to supply directly the tunnel diode detector without the need for additional amplifying circuitry. It will also be obvious to those skilled in the art that the biasing arrangement to be used with the tunnel diode detector may use compensating devices, such as thermistors, for example, should it be required to maintain the bias accurately in the presence of wide variations in ambient temperature. Many other modifications and variations of this invention will suggest themselves to those skilled in the art and fall within the scope of the subject invention as defined solely by the following claims.

What is claimed as new and desired to be secured by Letters Patent of the United States is:

1. An amplitude modulation detector comprising:
(a) a tunnel diode having a load impedance in series therewith;
(b) means to bias said diode for operation substantially at the peak point of its current-voltage characteristic where a change in voltage produces reduced current in said load impedance; and,
(c) means to supply an amplitude modulated signal to said diode whereby a voltage appears on said load impedance corresponding to the modulation envelope of said signal.

2. In a detector for radio frequency carrier oscillations amplitude modulated by audio frequency signals, the combination comprising:
(a) a tunnel diode;
(b) an audio frequency load impedance in series with said tunnel diode;
(c) means to bias said tunnel diode near the peak point of its current-voltage characteristic; and,
(d) means to supply said audio signal modulated oscillations across said diode whereby said audio signals appear on said load impedance.

3. An amplitude modulation detector comprising:
(a) a tunnel diode;
(b) means connected to said tunnel diode to supply to said diode an amplitude modulated carrier signal;
(c) filter means connected to said tunnel diode, said filter means having a low impedance in the frequency range of said carrier and having a relatively high impedance in the frequency range of the amplitude modulating signal of said carrier; and
(d) low impedance forward biasing means connected to said diode to provide quiescent operation near the peak point of the current-voltage characteristic of said diode, whereby the voltage across said filter means corresponds to a full-wave detection of the amplitude modulating signal of said carrier.

4. A low-level amplitude modulation detector comprising:
(a) a tunnel diode having a quiescent bias near the peak point of its current-voltage characteristic curve;
(b) low impedance means for supplying to said diode an amplitude modulated signal to the amplitude detected;
(c) filter means comprising a capacitor and a resistor disposed in parallel circuit relationship, said filter means having a low impedance in the frequency range of said carrier and having a relatively high impedance in the frequency range of the amplitude modulating signal of said carrier; and
(d) conductive means connecting said tunnel diode, said low impedance means and said filter means in series circuit loop relationship, whereby the voltage across said filter corresponds to a full-wave detection of the modulating voltage of said amplitude modulated signal.

5. A full-wave amplitude modulation detector comprising:
(a) an electronic device having at least a first terminal and a second terminal, said device having a resistance characteristic between said terminals of a predetermined slope for terminal voltages between a first and a second magnitude, said device having a resistance between said terminals which is the negative of said predetermined slope for terminal voltages between said second magnitude and a third magnitude, said first magnitude being less than said second magnitude and said third magnitude being greater than said second magnitude;
(b) biasing means having a source resistance less than the characteristic resistance of said predetermined slope and having a voltage of magnitude close to said second magnitude;
(c) means for supplying to said device an amplitude modulated voltage having a maximum negative excursion less than the difference between said second magnitude and said first magnitude and having a maximum positive excursion less than the difference between said third magnitude and said second magnitude;
(d) filter means having a low impedance in the frequency range of said amplitude modulated voltage and having a relatively high impedance in the frequency range of the amplitude modulating signal thereof;
(e) conductive means for connecting said biasing means to said first terminal;
(f) conductive means for connecting said source of amplitude-modulated voltage to said first terminal; and
(g) conductive means for connecting said filter means to said second terminal, whereby the voltage at said second terminal is responsive to both positive and negative excursions of said amplitude modulated voltage to provide at said second terminal a voltage of magnitude corresponding to the modulating signal of said amplitude modulated voltage.

6. An amplifier and full-wave amplitude modulation detector circuit comprising:
(a) an amplifier device for amplifying an amplitude modulated carrier of given frequency and having a pair of output electrodes;
(b) a load circuit comprising a capacitor and inductance connected in parallel and resonant at said given frequency, a first point on said load circuit being connected for passage of direct current to one of said output electrodes;
(c) a bias resistor connected at one end thereof to a second point on said load circuit;
(d) a source of voltage and means connecting said source of voltage between the remaining end of said bias resistor and the other one of said output electrodes, whereby said source of voltage, said amplifier device, and said bias resistor are included in a direct-current conductive path;
(e) a tunnel diode having one electrode thereof connected to a point on said load circuit; and
(f) a load impedance connected between the other electrode of said tunnel diode and a point on said direct-current conductive path;
(g) said bias resistor having a value of resistance to cause said tunnel diode to be biased for operation at substantially the peak point of its current-voltage characteristic whereby a change in voltage produces reduced current in said load impedance, whereby a detected signal will be produced at said load impedance corresponding to the modulation envelope of said modulated carrier.

References Cited

UNITED STATES PATENTS

| | | | |
|---|---|---|---|
| 3,187,273 | 6/1965 | Chasek | 329—205 XR |
| 3,197,654 | 7/1965 | Newby et al. | 329—205 X |

ROY LAKE, *Primary Examiner.*

UNITED STATES PATENT OFFICE

CERTIFICATE OF CORRECTION

Patent No. 3,324,402 June 6, 1967

Joseph A. Worcester

It is hereby certified that error appears in the above numbered patent requiring correction and that the said Letters Patent should read as corrected below.

Column 5, line 53, for "the" read -- be --.

Signed and sealed this 2nd day of January 1968.

(SEAL)
Attest:

Edward M. Fletcher, Jr.
Attesting Officer

EDWARD J. BRENNER
Commissioner of Patents